(12) United States Patent
Dallaire et al.

(10) Patent No.: US 11,750,166 B2
(45) Date of Patent: Sep. 5, 2023

(54) METHOD AND DEVICE FOR HIGH BANDWIDTH RECEIVER FOR HIGH BAUD-RATE COMMUNICATIONS

(71) Applicant: Marvell Asia Pte. Ltd., Singapore (SG)

(72) Inventors: Stephane Dallaire, Ottawa (CA); Ray Luan Nguyen, Irvine, CA (US); Geoffrey Hatcher, Irvine, CA (US)

(73) Assignee: Marvell Asia Pte. Ltd., Singapore (SG)

( * ) Notice: Subject to any disclaimer, the term of this patent is extended or adjusted under 35 U.S.C. 154(b) by 0 days.

(21) Appl. No.: 17/148,368

(22) Filed: Jan. 13, 2021

(65) Prior Publication Data

US 2022/0224302 A1    Jul. 14, 2022

(51) Int. Cl.
   *H03H 7/38*      (2006.01)
   *H04B 1/16*      (2006.01)
   *H03F 3/19*      (2006.01)

(52) U.S. Cl.
   CPC ............... *H03H 7/38* (2013.01); *H03F 3/19* (2013.01); *H04B 1/16* (2013.01)

(58) Field of Classification Search
   CPC ...... H03M 1/1245; H03M 1/122; H03M 1/54; H03M 1/183; H03F 3/193; H03F 1/223
   See application file for complete search history.

(56) References Cited

U.S. PATENT DOCUMENTS

| | | |
|---|---|---|
| 5,977,796 A | 11/1999 | Gabara |
| 6,111,431 A | 8/2000 | Estrada |
| 6,118,438 A | 9/2000 | Ho |
| 6,316,964 B1 | 11/2001 | Watarai |
| 6,417,708 B1 | 7/2002 | Fiedler |
| 6,552,582 B1 | 4/2003 | Bryan et al. |
| 6,686,772 B2 | 2/2004 | Li et al. |
| 7,728,753 B2 | 6/2010 | Taft et al. |
| 8,086,208 B2 | 12/2011 | Cook et al. |
| 8,638,130 B1 | 1/2014 | Olsen |
| 9,219,490 B1 | 12/2015 | Pereira et al. |
| 9,496,840 B2 | 11/2016 | Lemkin et al. |

(Continued)

OTHER PUBLICATIONS

Kexu Sun, "A 56-GS/s 8-Bit Time-Interleaved SAR ADC in 28-nm CMOS", Electrical Engineering, Southern Methodist University, May 19, 2018 (Year: 2018).*

(Continued)

*Primary Examiner* — Aristocratis Fotakis

(57) ABSTRACT

An analog front-end (AFE) device and method for a high baud-rate receiver. The device can include an input matching network coupled to a first buffer device, which is coupled to a sampler array. The input matching network can include a first T-coil configured to receive a first input and a second T-coil configured to receive a second input. The first buffer device can include one or more buffers each having a bias circuit coupled to a first class-AB source follower and a second class-AB source follower. The sampling array can include a plurality of sampler devices configured to receive a multi-phase clocking signal. Additional optimization techniques can be used, such as having a multi-tiered sampler array and having the first buffer device configured with separate buffers for odd and even sampling phases. Benefits of this AFE configuration can include increased bandwidth, sampling rate, and power efficiency.

20 Claims, 11 Drawing Sheets

(56) References Cited

U.S. PATENT DOCUMENTS

| | | | |
|---|---|---|---|
| 9,647,643 | B2 | 5/2017 | Gorecki et al. |
| 10,110,204 | B2 | 10/2018 | Gorecki et al. |
| 10,374,838 | B2 | 8/2019 | Jiang et al. |
| 10,790,845 | B1 | 9/2020 | Zanchi et al. |
| 10,873,486 | B1 | 12/2020 | Aboudina et al. |
| 11,157,037 | B1 | 10/2021 | Nguyen et al. |
| 11,309,904 | B1 | 4/2022 | Nguyen et al. |
| 11,507,129 | B2 | 11/2022 | Nguyen et al. |
| 2003/0094977 | A1 | 5/2003 | Li et al. |
| 2006/0151851 | A1* | 7/2006 | Pillai ............... H01L 24/48 257/531 |
| 2008/0191774 | A1 | 8/2008 | Lytollis |
| 2008/0246511 | A1 | 10/2008 | Miura et al. |
| 2009/0167400 | A1 | 7/2009 | Tokunaga et al. |
| 2010/0060320 | A1 | 3/2010 | Lee |
| 2010/0153041 | A1 | 6/2010 | Doris |
| 2011/0204930 | A1* | 8/2011 | Agarwal ............ G11C 27/024 327/111 |
| 2014/0040700 | A1 | 2/2014 | Kobori et al. |
| 2014/0105339 | A1* | 4/2014 | Zhu .................. H03M 1/1215 375/354 |
| 2014/0232575 | A1 | 8/2014 | Le Dortz et al. |
| 2015/0070065 | A1 | 3/2015 | Dedic et al. |
| 2016/0056799 | A1 | 2/2016 | Ximenes et al. |
| 2016/0240230 | A1 | 8/2016 | Lee |
| 2018/0275230 | A1* | 9/2018 | Trakimas ............ G01R 33/302 |
| 2020/0059222 | A1 | 2/2020 | Cheung et al. |
| 2020/0195265 | A1* | 6/2020 | Ali ..................... H03M 1/1033 |
| 2020/0319893 | A1 | 10/2020 | Wilkinson |
| 2020/0349420 | A1 | 11/2020 | Ovsiannikov et al. |
| 2021/0021278 | A1* | 1/2021 | Belostotski .......... H03M 1/164 |
| 2021/0135678 | A1* | 5/2021 | Pu ...................... H03M 1/1028 |
| 2021/0184637 | A1* | 6/2021 | Zanchi ................. H03F 1/223 |
| 2022/0200532 | A1* | 6/2022 | Agrawal ............. H03D 7/1458 |

OTHER PUBLICATIONS

Naftali Weiss, "Ultra-Wideband Multi-Phase Clock Generation for 200+GS/s Time Interleaved ADCs", Graduate Department of Electrical and Computer Engineering, University of Toronto, 2019 (Year: 2019).*

Yizhak Shifman, Yoel Krupnik, Udi Virobnik, Ahmad Khairi, Yosi Sanhedrai and Ariel Cohen, "A 1,64mW Differential Super Source-Follower Buffer with 9.7GHz BW and 43dB PSRR for Time Interleaved ADC Applications in 10nm", Intel Corporation, IEEE Asian Solid-State Circuits Conference, Nov. 4-6, 2019 (Year: 2019).*

Cordova et al ("A Hierarchical Track and Hold Circuit for High Speed ADC-Based Receivers in 22nm FDSOI", 2019 26th IEEE International Conference on Electronics, Circuits and Systems (ICECS), Nov. 27-29, 2019 (Year: 2019).*

San Deep Gupta et al., "A 1 GS/s 11 b Time-Interleaved ADC in 0.131-Im CMOS", Proceedings of the 2006 International Solid State Circuit Conference, Feb. 8, 2006, Session 31-6.

Tang Kai et al., "A 20GSps Track-and-Hold Circuit in 90nm CMOS Technology", 2012 International Conference on Advanced Technologies for Communications, 2012, pp. 237-240.

Shahriar Shahramian et al., "A 30-GS/s Track and Hold Amplifier in 0.13-IJm CMOS Technology", IEEE 2006 Custom Integrated Circuits Conference, 2006, pp. 493-496.

Simon Louwsma et al., "A Time-Interleaved Track & Hold in 0.131-Im CMOS sub-sampling a 4 GHz Signal with 43dB SNDR", IEEE 2007 Custom Integrated Circuits Conference, 2007, pp. 329-332.

Cheng-Chung Hus et al., "An 11 b 800MS/s Time-Interleaved ADC wth Digital Background Calibration", Proceedings of the 2007 International Solid State Circuit Conference, Feb. 14, 2007, pp. 464-465, 615.

Francesco Centurelli et al., "Design Solutions for Sample-and-Hold Circuits in CMOS Nanometer Technologies", IEEE Transactions of Circuits and Systrems-11: Express Briefs, , Jun. 2009, pp. 459-463, vol. 56, No. 6.

European Search Report for European Application No. EP 21 20 6212 dated Mar. 31, 2022.

International Search Report and Written Opinion corresponding to International Application No. PCT/US2022/012263 dated Apr. 26, 2022, 10 pages.

Athreya Shankarram et al.: "Clock Synchronous Reset and Skew Calibration of 65GS/s ADCs in A Multi-Lane Coherent Receiver", ESSCIRC 2018—IEEE 44th European Solid State Circuits Conference (ESSCIRC), IEEE, Sep. 3, 2018 (Sep. 3, 2018), pp. 250-253, XP033420659, DOI: 10.1109/ESSCIRC.2018.8494254 [retrieved on Oct. 16, 2018].

Luca Vercesi et al.: "Two-Dimensions Vernier Time-to-Digital Converter", IEEE Journal of Solid-State Circuits, IEEE, USA, vol. 45, No. 8, Aug. 1, 2010 (Aug. 1, 2010), pp. 1504-1512, XP011314246, ISSN: 0018-9200, DOI: 10.1109/JSSC.2010.2047435 * Section III.C; Section IV.A; figures 4,5,8 *.

Lingli Xia et al.: "Sub-2-ps, Static Phase Technique Incorporating Measurement Uncertainty Cancellation for Multi -Time—T/H Circuits", IEEE Transactions On Circuits and Systems IEEE, US, vol. 59, No. 2, 1 (Feb. 2012), pages XP011394661, ISSN: 1549-8328, DOI: figures 1,4,5,9.

* cited by examiner

METHOD AND DEVICE FOR HIGH BANDWIDTH RECEIVER FOR HIGH BAUD-RATE COMMUNICATIONS

CROSS-REFERENCES TO RELATED APPLICATIONS

The present application incorporates by reference, for all purposes, the following patent applications, all commonly owned: U.S. patent application Ser. No. 17/097,791, titled "METHOD AND DEVICE FOR CLOCK GENERATION AND SYNCHRONIZATION FOR TIME INTERLEAVED NETWORKS, filed Nov. 13, 2020; and U.S. patent application Ser. No. 14/614,257, titled "LOW POWER BUFFER WITH GAIN BOOST", filed Feb. 4, 2015, now U.S. Pat. No. 9,432,000.

BACKGROUND OF THE INVENTION

The present invention generally relates to communication systems and integrated circuit (IC) devices. More specifically, the present invention provides for a method and device for high bandwidth receivers for high baud-rate communications. Merely by way of example, the present invention is applied to coherent optical receivers. However, the present invention has a much broader range of applicability, such as any high baud-rate receivers, and the like.

Over the last few decades, the use of communication networks has exploded. In the early days of the Internet, popular applications were limited to emails, bulletin boards, and mostly informational and text-based web page surfing. The amount of data transferred by such applications was relatively small. Today, the Internet and mobile applications demand a huge amount of bandwidth for transferring photo, video, music, and other multimedia files. For example, a social networking platform can process more than 500 TB of data daily. With such high demands on data storage and data transfer, existing data communication systems need to be improved to address these needs.

High baud-rate receivers tend to require high-performance Digital Signal Processing (DSP) ICs to recover the signal in the presence of optical and electrical impairments. These DSP receivers are usually implemented to minimize power dissipation, which is critical to meet the power envelope/limit of a given module form factor. In addition to the large amount of DSP, these integrated circuits also include high bandwidth, high linearity Analog-Front-Ends (AFEs), followed by a high sampling rate Analog-to-Digital Converters (ADCs). Implementing high bandwidth, high performance AFEs in these advanced process nodes is becoming exceedingly more challenging due to increasingly higher parasitic capacitance and resistance overheads, higher 1/f noise, and smaller voltage headroom.

There have been many conventional types of methods and devices for AFEs. Unfortunately, such conventional methods and devices suffer from various drawbacks, including increased chip area, production cost, power consumption, etc. Therefore, improved communication systems with devices and methods using more efficient AFEs are highly desired.

BRIEF SUMMARY OF THE INVENTION

The present invention generally relates to communication systems and integrated circuit (IC) devices. More specifically, the present invention provides for a method and device for high bandwidth receivers for high baud-rate communications. Merely by way of example, the present invention is applied to coherent optical receivers. However, the present invention has a much broader range of applicability, such as any high baud-rate receivers, and the like.

According to an example, the present invention provides a method and structure for an analog front-end (AFE) device configured for a high-baud receiver. The AFE device can include an input matching network receiving a first input and a second input, a first buffer device coupled to the input matching network, and a sampler array coupled to the first buffer device. The sampler array includes a plurality of sampler devices and is configured to receive a multi-phase clocking signal to drive the sampler devices.

In an example, the input matching network includes a first T-coil configured to the first input and a second T-coil configured to the second input. Each of the first and second T-coils comprises a negative-k T-coil, a positive coupling T-coil, or the like. Each of the first and second T-coils can also be coupled to a pair of Electro-Static-Discharge (ESD) diodes and coupled to a termination resistor.

In an example, the first buffer device can include a bias circuit coupled to a first class-AB source follower and a second class-AB source follower, the first class-AB source follower being configured to receive the first input, and the second class-AB source follower being configured to receive the second input. The first and second class-AB source followers can be configured with a DC bias resistor and an AC coupling capacitor. In a specific example, the first buffer device can include two or more buffers operating in parallel.

In an example, the AFE device can include a pedestal clock bias voltage circuit and a sample block bias voltage circuit coupled to the output of the first buffer device. The pedestal clock bias voltage circuit can include a first resistor ladder coupled to the output of the first buffer and having a plurality of first tap points, and can also include a first multiplexer coupled to first resistor ladder and configured to select between the plurality of first tap points. The sample clock bias voltage circuit can include a second resistor ladder coupled to the output of the first buffer and having a plurality of second tap points, and can also include a second multiplexer coupled to the second resistor ladder and configured to select between the plurality of second tap points.

In an example, each of the plurality of samplers of the sampler array includes a sampler switch coupled to a sampling capacitor and a second buffer device. The multi-phase clocking signal can be configured to drive the sampler switches of the plurality of samplers. Each buffer device includes a differential source follower having cross-coupled transistor stacks. In a specific example, each second buffer device includes a programmable attenuation circuit coupled to the differential outputs of the differential source follower of the second buffer. The programmable attenuation circuit can have one or more programmable attenuation branches with each branch having a voltage-controlled resistor.

In a specific example, the first buffer device can include a first buffer and a second buffer. A first portion of the plurality of sampler devices can be configured with the first buffer of the first buffer device for odd sampling phases, while a second portion of the plurality of sampler devices can be configured with the second buffer of the first buffer device for even sampling phases. In various examples, the first buffer devices can include a plurality of buffers, each configured for different sampling phases or different sets of samplers in the sampler array. Further, the sampler array can be configured in a multi-tiered configuration.

Many benefits are recognized through various embodiments of the present invention. Such benefits include increased bandwidth, sampling rate, and power efficiency. Depending upon the embodiment, the techniques implemented in the present invention are also cost-effective and relatively simple to implement. Other such benefits will be recognized by those of ordinary skill in the art.

The present invention achieves these benefits and others in the context of known IC fabrication processes. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
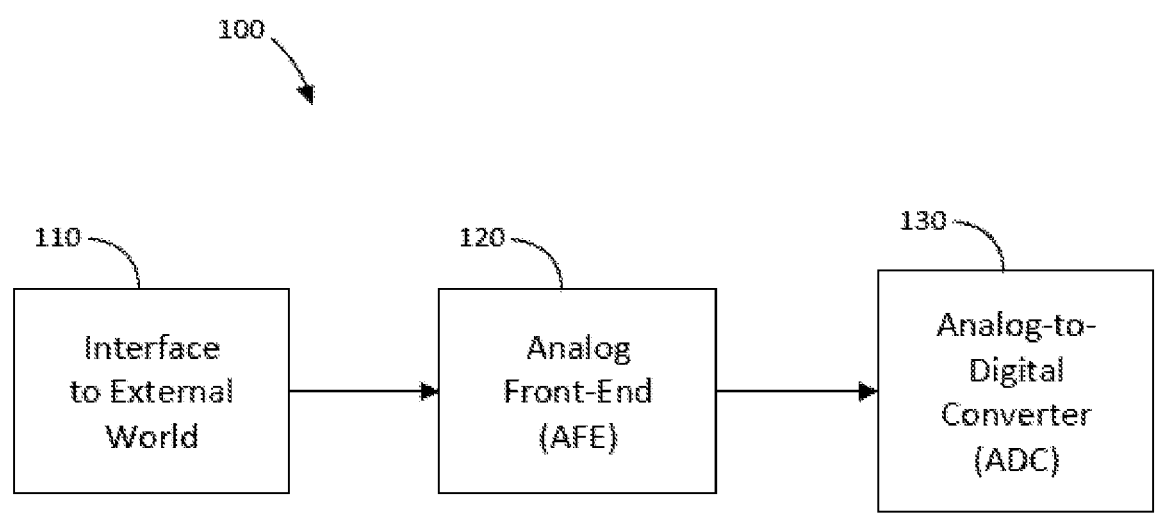
FIG. 1 is a simplified block diagram illustrating a receiver device according to an example of the present invention.

The present invention generally relates to communication systems and integrated circuit (IC) devices. More specifically, the present invention provides for a method and device for high bandwidth receivers for high baud-rate communications. Merely by way of example, the present invention is applied to coherent optical receivers. However, the present invention has a much broader range of applicability, such as any high baud-rate receivers, transceivers, and the like.

High baud-rate receivers, like optical coherent receivers for 400G or higher rate applications, require high-performance Digital Signal Processing (DSP) ICs to recover the signal in the presence of optical and electrical impairments. These DSP receivers are usually implemented in CMOS to allow integration of a large amount of DSP on a single chip to minimize power dissipation, which is critical to meet the power envelope/limit of a given optical module form factor. In addition to the large amount of DSP, these integrated circuits also include high bandwidth, high linearity Analog-Front-Ends (AFEs), followed by a high sampling rate Analog-to-Digital Converters (ADCs).

As CMOS process nodes scale down to smaller geometries, higher level of integration and lower power dissipation can be achieved, which enable next generation, higher baud-rate applications. However, it is well known that advanced process nodes (e.g., 7 nm FinFET) are optimized for digital integration. Implementing high bandwidth, high performance AFEs in these advanced process nodes is becoming exceedingly more challenging due to increasingly higher parasitic capacitance and resistance overheads, higher 1/f noise, and smaller voltage headroom.

The present invention provides several methods and devices using techniques to a high-bandwidth AFE driving an array of sub-ADCs. In an example, such an AFE device is able to achieve in excess of 40 GHz bandwidth and an aggregated sampling rate of 100 GS/s or higher. Those of ordinary skill in the art will recognize the different variations, combinations, and alternatives based on the specifics disclosed here. Further details of various examples of the present invention are discussed below.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counterclockwise have been used for convenience purposes only and are not intended to imply any particular fixed direction. Instead, they are used to reflect relative locations and/or directions between various portions of an object.

FIG. 1 is a simplified block diagram illustrating a receiver device 100 according to an example of the present invention. According to an example, a general receiver typically has a structure as shown in FIG. 1, which comprises an interface 110 to the external world, an Analog Front-End (AFE) 120, and an Analog-to-Digital Converter (ADC) 130. The objective of this system is to acquire or sample an analog input signal, by the interface 110, and condition it in the most optimal way, using the AFE 120, prior to feeding to the ADC 130 for conversion into the digital domain.

In an example, the present high baud rate receiver design can incorporate several techniques for optimization. For a given desired bandwidth and aggregate sampling rate, the present invention can include determining the power-to-noise sensitivity of each block and assign to each block a power P and a noise budget N (note: noise here refers to all imperfections including thermal noise, distortion, supply rejection residuals, jitter, etc.). From the desired system bandwidth BW, the present invention can include determining a lower bound on the effective total capacitance $C_{AFE}$ that the AFE needs to have to support its noise budget while staying within the power budget. From the AD power-to-noise sensitivity, the present invention can also include determining the maximum sampling rate and effective capacitance $C_{ADC}$ that each sub-ADC can support to stay within its power and noise budget. From the ratio of $C_{AFE}$ and $C_{ADC}$ and inter-symbol interference (ISI) considerations, the present invention can further include determining the bounds on the number of stages and their effective fanout (FO) to effectively drive the input signal with sufficient signal-to-noise (SNR) into the ADC from the AFE input.

The techniques described above can be used in combination with all applicable implementation details and considerations as further described in the present specification. In an example, these techniques can be used in an iterative process until a desired design is achieved. In a specific example, the desired design can include where a weighted ratio between bandwidth to power and total SNR is maximized. One of ordinary skill in the art would recognize other variations, modifications, and alternatives.

Figure 2:
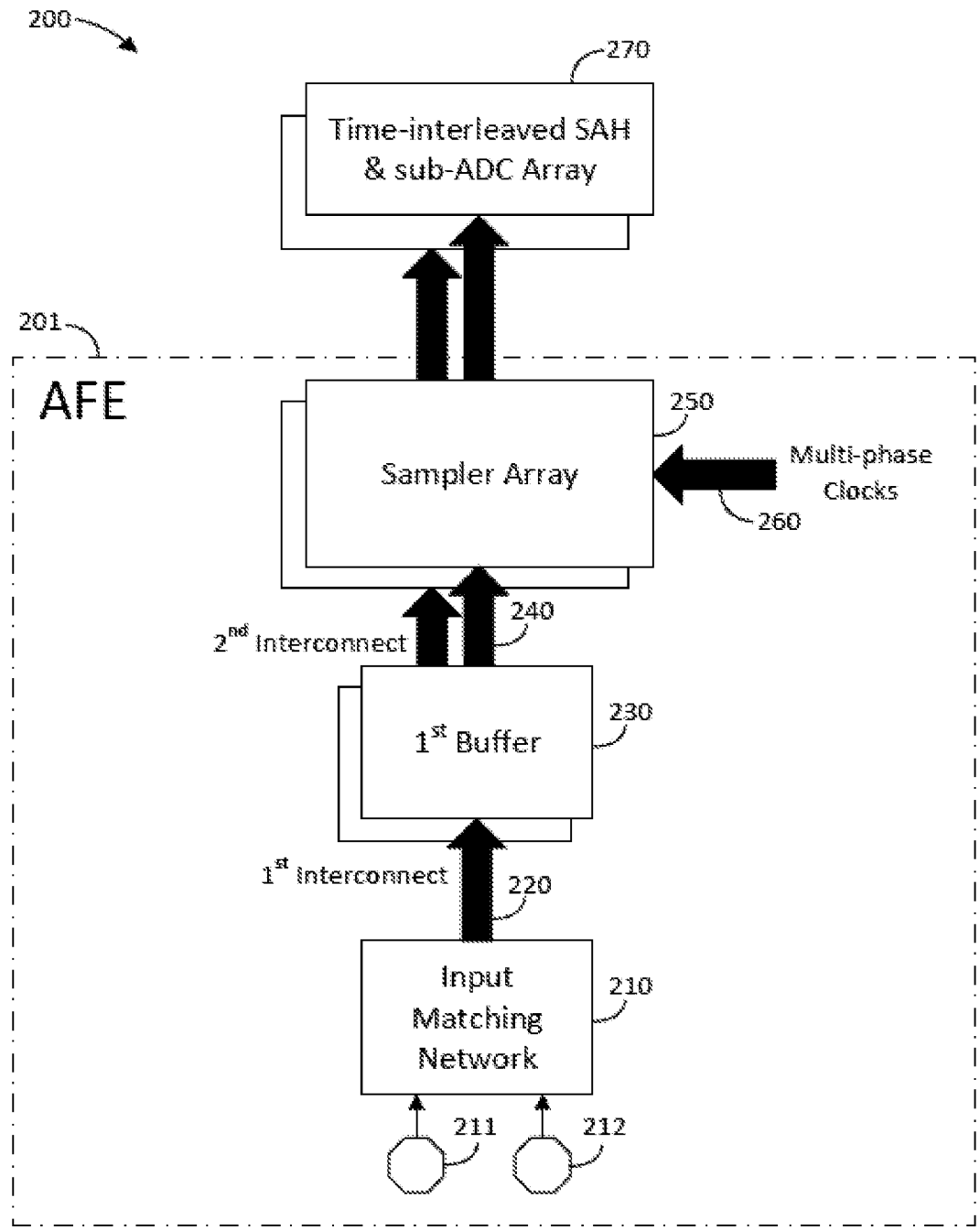
FIG. 2 is a simplified block diagram illustrating a receiver device according to an example of the present invention.

An example architecture of the high bandwidth receiver 200 is shown in FIG. 2. This receiver architecture illustrated by a simplified block diagram as an example of the present invention, which can be used for 400G coherent receiver applications and the like. In this example, the AFE 201 is coupled to ADC via a time-interleaved sample-and-hold (SAH) and sub-ADC array 270. Although the sub-ADC array 270 of the ADC is shown, those of ordinary skill in the art will recognize the variations, modifications, and alternatives to the configurations between the AFE and ADC.

Figure 3:
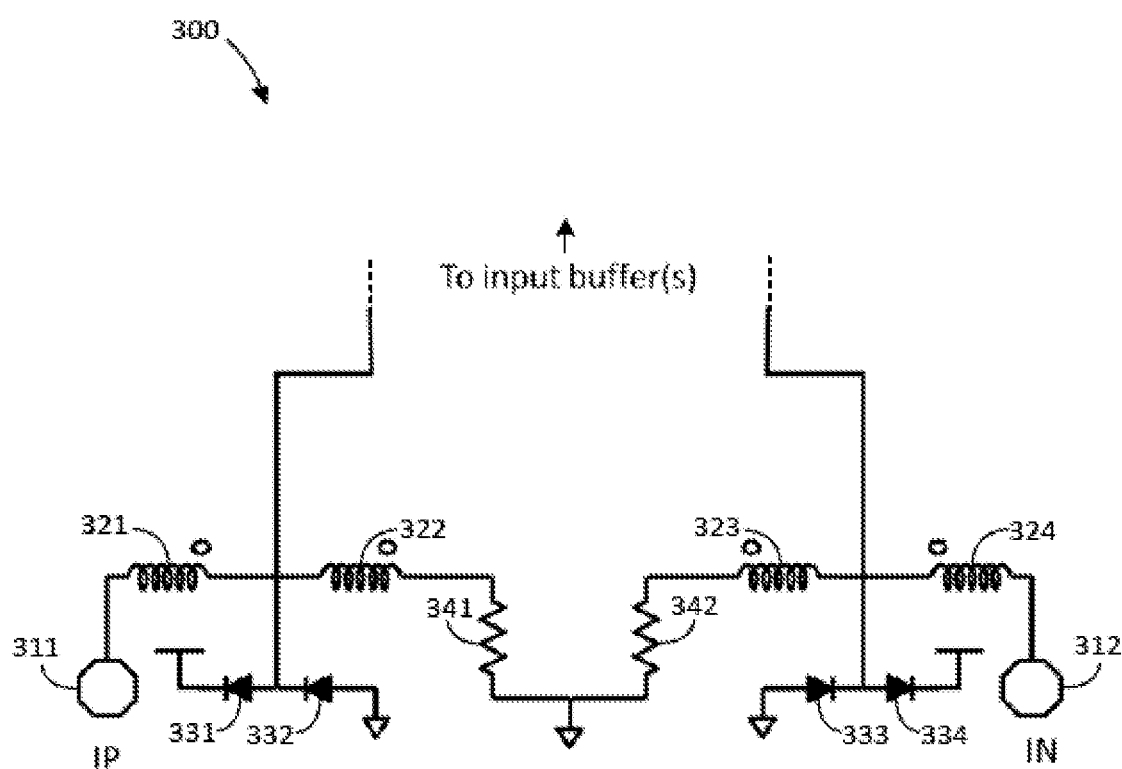
FIG. 3 is a simplified circuit diagram illustrating an input matching network according to an example of the present invention.

In an example, the AFE 201 can include at least three stages from the input bumps 211, 212 all the way to the input of the sub-ADC array 270. Here, the first AFE stage in the signal chain is the input matching network 210, which is shown greater detail in FIG. 3. FIG. 3 is a simplified circuit diagram illustrating an input matching network 300 according to an example of the present invention. As shown, network 300 can include Electro-Static Discharge (ESD) protection diodes 331-334, input termination resistors 341/342, and T-coil structures using pairs of inductors 321/322 and 323/324. This ESD protection diodes 331-334 and the input termination resistors 341/342 can be calibrated to compensate for silicon process variations. The T-coil configurations can mitigate the impact of capacitance from interconnect, ESD, input buffer(s) on input return loss and bandwidth, and the like. Following receipt by this input matching network 300, the compensated input signal is passed along through the outputs (marked by dotted lines) to the input buffers.

In the example shown in FIG. 3, the input matching network 300 includes differential inputs 311/312 denoted as "IP" and "IN", respectively. Each of these differential inputs is connected to a separate T-coil configuration from one of the side nodes; Input IP 311 is coupled to inductor 321 while Input IN 312 is coupled to inductor 324. In a specific example, the T-coil configuration can use a negative-k T-coil, a positive coupling T-coil, or the like and combinations thereof. The bottom of each T-coil configuration is coupled to a pair of the ESD diodes at the bottom node; the connection node between inductors 321/322 is coupled to the connection node between diodes 331/332 while the connection node between inductors 323/324 are coupled to connection node between diodes 333/334. The diodes of each diode pair are also coupled to a power source (e.g., power supply, supply voltage, voltage rail, etc.) and ground and configured to allow current to flow from ground to the power source.

More specifically, the cathodes of diodes 331 and 334 are each coupled to a power source (e.g., voltage rail), and the anodes of diodes 332 and 333 are each coupled to ground. The cathode of diode 332 is coupled to the anode of diode 331 and the cathode of diode 333 is coupled to the anode of diode 334. In a specific example, this input matching network 300 can be configured symmetrically to minimize coupling. The interconnect (i.e., $1^{st}$ interconnect 220 shown in FIG. 2) between the T-coils of the input matching network and the two $1^{st}$ Buffer instances can be configured as a long interconnect that enhances bandwidth by acting as a series peaking component. Further, the T-coils, the $1^{st}$ interconnect, and the $2^{nd}$ interconnect can all be spatially configured apart sufficiently far away from each other to minimize coupling. There can be other variations, modifications, and alternatives.

Returning to FIG. 2, the signal coming out of the input matching network 210, after the T-coil and through the $1^{st}$ interconnect 220, is routed to the second AFE stage, which is a buffer stage 230 labeled as the $1^{st}$ Buffer in FIG. 2. According to various examples, there could be a single $1^{st}$ Buffer instance or multiple operating in parallel depending on the number of time-interleaved samplers. In an example, there are two $1^{st}$ Buffer instances 230 in parallel, each driving a plurality of time-interleaved samplers (e.g., 4, 8, 16, etc.). In a specific example, the layout floorplan (shown in FIG. 11) is such that the inductance from $1^{st}$ interconnect is sufficiently large to improve the overall bandwidth, through series peaking. Further details are discussed with reference to FIG. 11.

Figure 4:
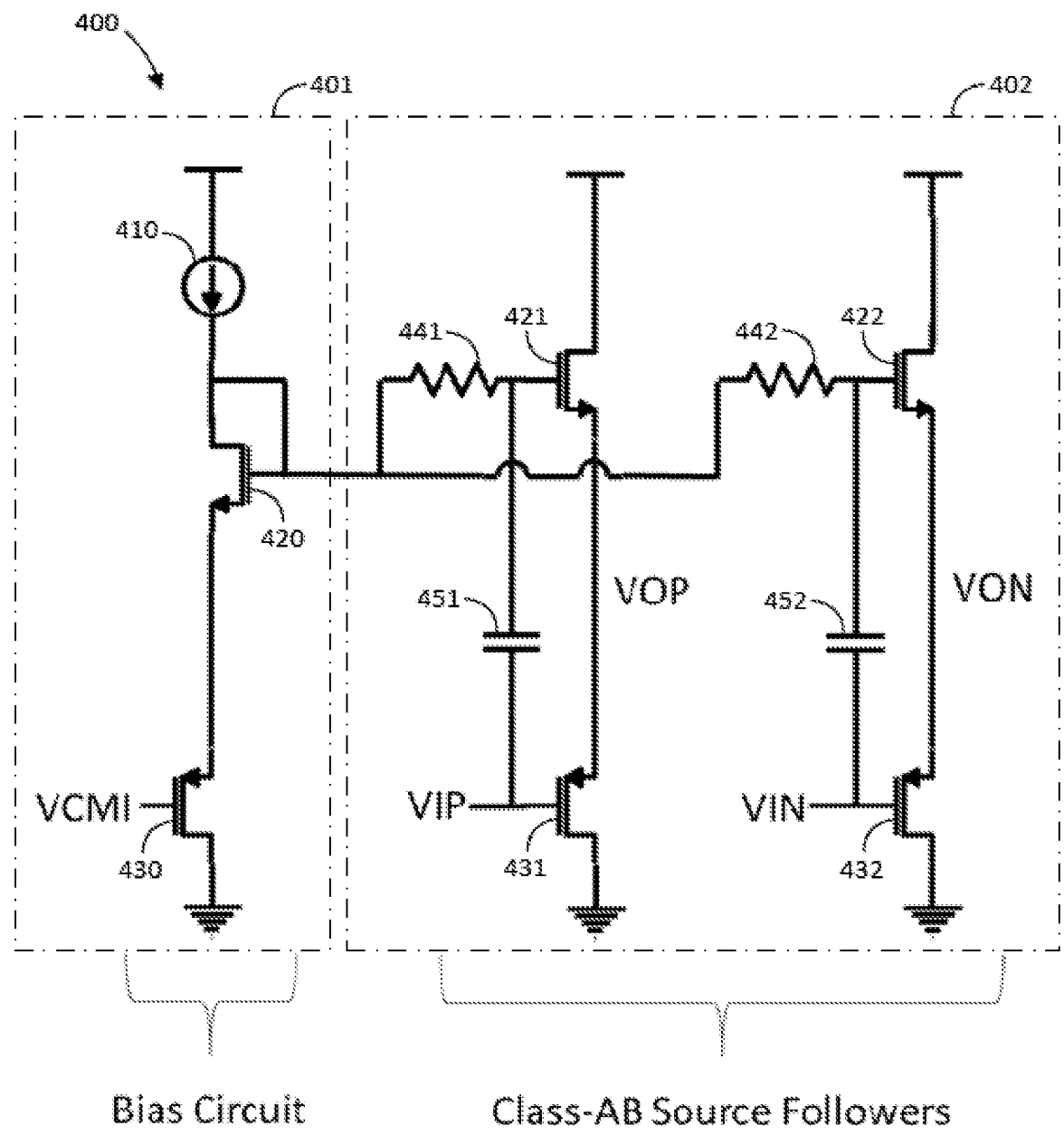
FIG. 4 is a simplified circuit diagram illustrating a buffer device according to an example of the present invention.

Multiple topologies are possible for the "$1^{st}$ Buffer" instances. For applications where maximizing AFE bandwidth is of the utmost importance (e.g., coherent communications) and where the input signal level is usually sufficiently large not to require any amplification, a source follower or one of its variants is often used due to its low output impedance, which is beneficial to drive a large capacitive load while maintaining high bandwidth. FIG. 4 is a simplified circuit diagram illustrating a buffer device 400 according to an example of the present invention. As shown, the topology can include a bias circuit 401 and class-AB source followers 402.

In this example, the bias circuit 410 includes a current source 410 configured to provide a current through an NMOS transistor 420 (with connected gate and drain) and a PMOS transistor 430 configured to receive a bias voltage at its gate, denoted as "VCMI". The current source is coupled to a power source (e.g., power supply, supply voltage, voltage rail, etc.), the source of the NMOS transistor 420 is coupled to the source of the PMOS transistor 430, and the drain of the PMOS transistor 430 is coupled to ground. Further, the output of this bias circuit 401 is at the connected gate/drain node of NMOS transistor 420.

Following the bias circuit 410, the class-AB source followers 402 include NMOS transistors 421 and 422, which are each coupled at the drain to the power source and coupled at the source to the source of PMOS transistors 431 and 432, respectively. The gates of each connected pair of NMOS/PMOS transistors 421/431 and 422/432 are coupled to capacitors 451 and 452, respectively. In a specific example, these capacitors 451 and 452 are configured as AC coupling capacitors. Also, the gates of each PMOS transistor 421 and 422 are also coupled to resistors 441 and 442, respectively, which are each also coupled to the output of the bias circuit 401. In as specific example, these resistors 441 and 442 are configured as DC bias resistors. Further, the gate of PMOS transistor 431 is configured to receive one of the differential input signals (shown as "VIP") while the gate of the PMOS transistor 432 is configured to receive the other differential input signal (shown as "VIN").

In this example, the PMOS common-drain transistors (i.e., PMOS source followers) are DC coupled to the input whereas the NMOS common-drain transistors (i.e., NMOS source followers) are AC coupled, with the DC bias set by a replica biasing circuit to set the bias current. Other implementations are possible, such as a DC coupled NMOS source followers and AC coupled PMOS source followers. Both NMOS and PMOS source followers can be AC coupled as well. Equivalent implementations using other transistor technologies (e.g., BiCMOS, IGBT, etc.) may also be used. Those of ordinary skill in the art will recognize other variations, modifications, and alternatives to these bias circuit and source follower configurations.

The $1^{st}$ Buffer device using the class-AB topology discussed previously can have several advantages over standard source follower configurations. Such advantages include better large signal bandwidth and settling due to the push/pull behavior from the combined PMOS and NMOS common-drain transistors. Also, the $1^{st}$ Buffer device using the class-AB topology can exhibit better power efficiency (i.e., larger overall gm, lower output impedance) for a given bias current and current density into the transistors.

Returning to FIG. 2, each $1^{st}$ Buffer instance 230 can be configured to drive an array of time-interleaved samplers 250 by the $2^{nd}$ interconnect 240. In a specific example, the layout floorplan (shown in FIG. 10) is such that the inductance from the $2^{nd}$ interconnect between the $1^{st}$ Buffer 230 and the sampler array 250 in FIG. 2, is sufficiently large enough to improve the overall bandwidth, through series peaking. Further details are discussed in reference to FIG. 10.

Figure 5:
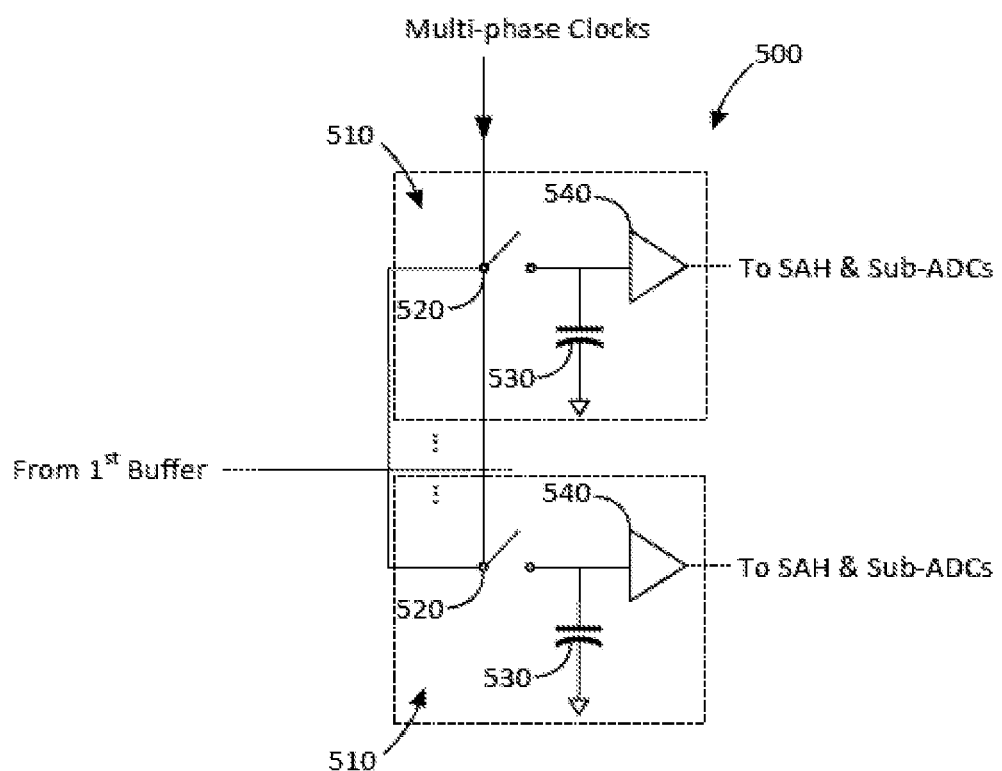
FIG. 5 is a simplified circuit diagram illustrating a sampling network according to an example of the present invention.

A high-level representation of the third AFE stage, which is a time-interleaved sampling network/sampler array 500 according to an example of the present invention, is shown in FIG. 5. This simplified circuit diagram shows the sampler array 500 including a plurality of sampling units 510 that receive the outputs of the $1^{st}$ Buffer devices and outputs to the sample-and-hold and sub-ADC array. Each sampling unit 510 includes at least a sampling switch 520, a sampling capacitor 530, and a buffer 540, labeled as "$2^{nd}$ Buffer". The sampling switch 520 is coupled to the $2^{nd}$ Buffer 540, and is driven by the multi-phase clock signals from a time-interleaved clocking circuit. The sampling capacitor 530 is configured between the sampling switch 520 and the $2^{nd}$ Buffer 540, and holds the sampled voltage at the input of the $2^{nd}$ Buffer 540. And, the $2^{nd}$ Buffer instances 540 of the sampling units 510 are configured to drive the sample-and-holds and the sub-ADCs subsequently connected to the sampler array 500.

In an example, the sampling switches 520 can be implemented using either an NMOS or a PMOS device depending on the input common mode, the sampling clock high and low voltage, and other considerations. To optimize performance, the sampling switches may or may not include feedthrough cancellation devices and pedestal cancellation switches depending upon the application. Further, multiple topologies are possible for the $2^{nd}$ Buffer instances. The key requirements can include low input capacitance, so that it does not prohibitively increase the sampling capacitor 530, and low output impedance to drive the long interconnect and capacitive load of the sample-and-holds and sub-ADCs with sufficiently small settling error. A source follower or one of its variants is often used due to its low output impedance. Those of ordinary skill in the art will recognize other variations, modifications, and alternatives for configuration of this sampler array.

Figure 6A:
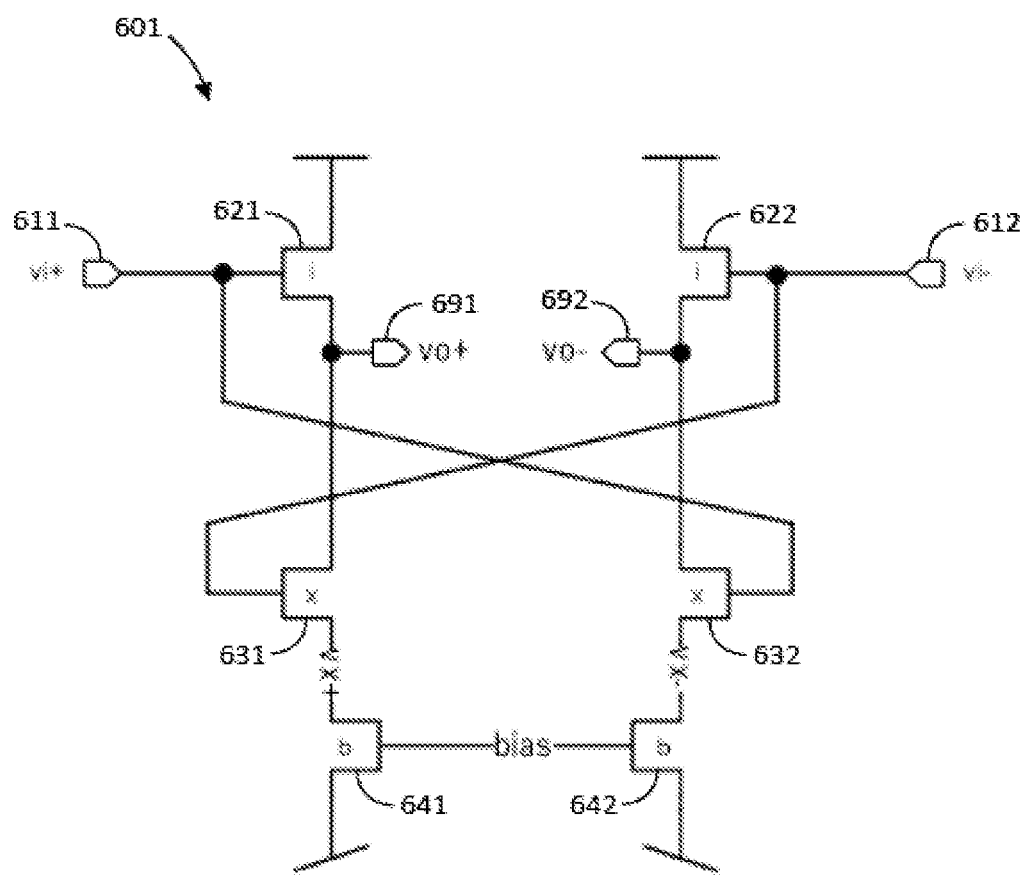
FIG. 6A is a simplified circuit diagram illustrating a buffer device according to an example of the present invention

FIG. 6A is a simplified circuit diagram illustrating a buffer device 601 (i.e., $2^{nd}$ Buffer instance) according to an example of the present invention. This $2^{nd}$ Buffer topology includes a differential source follower with cross-coupled transistors to provide gain boosting to maintain unity gain and to lower the output impedance. As shown, the positive side of the differential source follower includes a stacked transistor buffer with transistors 621, 631, and 641. Similarly, the negative side of the differential source follower includes a stacked transistor buffer with transistors 622, 632, and 642. Each stacked transistor buffer is coupled to a power source (e.g., voltage rail) and ground. The differential inputs 611 and 612 are received at the gates of transistors 621 and 622, while the differential outputs 691 and 692 are delivered at the connection between transistors 621 and 631 and the connection between transistors 622 and 632. The gates of transistors 631 and 632 are cross coupled to the differential inputs 611 and 612. And, this buffer 601 receives a bias voltage at the gates of transistors 641 and 642. Although FIG. 6A shows the buffer implementation using NMOS transistors, depending upon the application this buffer can be implemented using PMOS or other transistor technologies (e.g., BiCMOS, IGBT, etc.) as well.

Figure 6B:
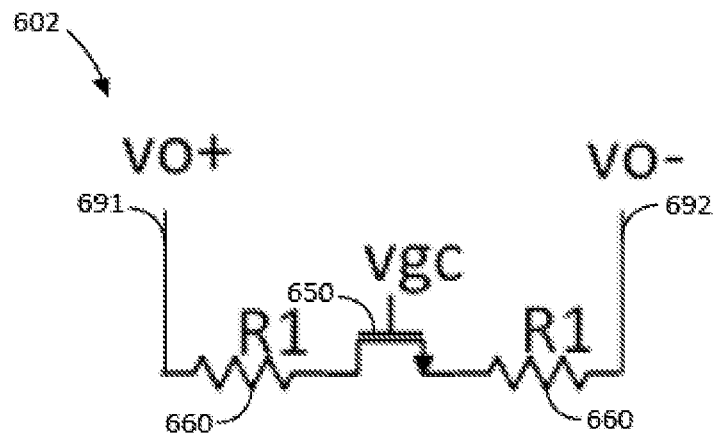
FIG. 6B is a simplified circuit diagram illustrating a programmable attenuation circuit according to an example of the present invention.

In a specific example, the buffer topology can include programmable attenuation capability for cases where the input signal amplitude is larger than the ADC full-scale. This programmable attenuation can also be used to compensate for gain mismatch between the track-and-hold instances, provided the attenuation control signals are independent. FIG. 6B is a simplified circuit diagram illustrating a programmable attenuation circuit 602 according to an example of the present invention. As shown in FIG. 6B, programmable attenuation can be implemented using two resistors 640, denoted as "R1", configured on both sides of a MOSFET transistor 650 and connected between the positive and negative outputs 691/692 of the $2^{nd}$ Buffer device 601 (shown in FIG. 6A). The gate voltage, denoted as "vgc", can be controlled by an analog voltage generated by a DAC, an op-amp, or other circuit to implement transistor 650 as a voltage-controlled resistor. This programmable resistor in series with the two instances of R1 implement a voltage divider with $2^{nd}$ Buffer differential impedance (~2/gm) to allow programmable attenuation of the differential output. In a specific example, the two resistors 660 (R1) connected in series with the MOS voltage-controlled resistor 650 (one on each side of the transistor) are configured especially at small overdrive voltage (e.g., less than 1V).

Figure 6C:
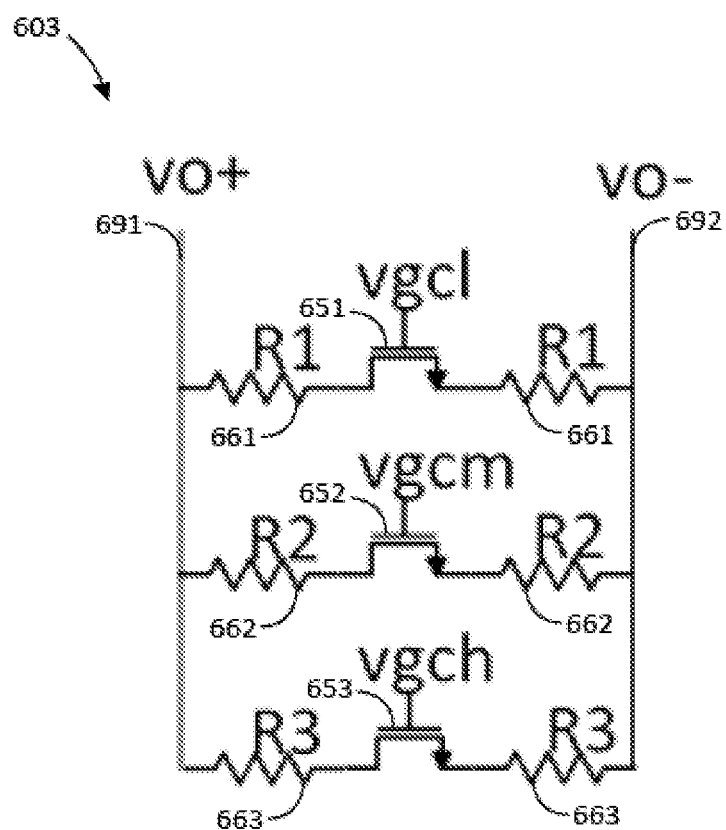
FIG. 6C is a simplified circuit diagram illustrating a multi-branch programmable attenuation circuit 603 according to an example of the present invention.

To further improve linearity, the programmable attenuation circuit can include one or more additional resistor-MOS-resistor branches configured in parallel. The number of additional branches can depend on the desired range of adjustment. FIG. 6C is a simplified circuit diagram illustrating a multi-branch programmable attenuation circuit 603 according to an example of the present invention. As shown, this circuit 603 includes three resistor-MOS-resistor branches connected between the positive and negative outputs 691/692 of the $2^{nd}$ Buffer device 601 (shown in FIG. 6A); the first branch including resistors 651 (denoted as "R1") and transistor 651 (gate voltage denoted as "vgcl"); the second branch including resistors 662 (denoted as "R2") and transistor 652 (gate voltage denoted as "vgcm"); and the third branch include resistors 663 (denoted as "R3") and transistor 653 (gate voltage denoted as "vgch"). In this case, the three-branch attenuation circuit 603 can be configured to provide a range of adjustment of about 3 dB. In various examples, the branches are scaled from the weakest to the strongest, from strongest to weakest, or any configuration of different strengths to achieve interpolation between their values. Also, the controlled gate voltages (e.g., vgcl, vgcm, and vgch in FIG. 6C) can be generated in a staggered fashion such that the weakest branch is turned on first. Further, the scaling factor between the branches can be vary depending on application, e.g., a factor of two. As discussed previously, equivalent implementations using other transistor technologies (e.g., BiCMOS, IGBT, etc.) may also be used. Those of ordinary skill in the art will recognize other variations, modifications, and alternatives to the $2^{nd}$ Buffer implementation.

High-sampling rate ADCs are usually implemented using an array of time-interleaved asynchronous Successive Approximation Register (SAR) ADCs due to their power efficiency. In advanced process codes, such as 7 nm FinFET, the optimal sampling rate of an asynchronous SAR (for power dissipation and noise performance) should be limited to about 0.8-1 GS/s or lower for optimal power-to-noise tradeoffs. This can require a large number of sub-ADCs operating in a time-interleaved fashion to achieve a high sampling rate. As a specific example, where the sampling rate can be as high as 100 GS/s, 128 sub-ADC instances can be used. Though, the size of the array can vary depending on application. Further, the array size determines the effective $C_{ADC}$ discussed previously.

Sampling Network:

To maintain sufficiently high bandwidth in the AFE, it is generally not practical to use a single stage of sampling switches for the sampler array 250 with all sampling switches in parallel due to the large capacitance that would result (from the off switches, the on switches, and the hold capacitors at the output of the on-switches) at the output of the $1^{st}$ Buffer 230. A single stage configuration would also require corresponding jitter critical and timing critical clock phases for each sampling switch, which would prohibitively increase power dissipation.

According to an example, the present invention provides for a sampler array architecture that splits the sampling into two or more tiers to reduce the number of track-and-hold switches in the first tier in order to maximize AFE bandwidth. This design minimizes the capacitance at the $1^{st}$ Buffer output, and also reduces the number of jitter critical and timing critical clock phases that need to be generated and distributed, which is beneficial for power dissipation.

In a specific example, the sampler array uses two-tier sampling configuration with 16 phases in the first tier and 8 in the second, for an aggregated 128 phases. This performance/power tradeoff of this configuration can achieve sufficient settling time at the $2^{nd}$ Buffer output while maintaining high bandwidth in the AFE. The design considerations include minimizing the capacitive load at the output of the $1^{st}$ Buffer 230 and minimizing size/power in the $1^{st}$ Buffer, which minimizes capacitance seen after the T-coil of the input matching network 210. Depending on the application, the design of other multi-tiered configurations can depend on additional considerations and result in a sampler array with a different total number of tiers and aggregated phases. Further details of discussed in reference to FIG. 10.

Tracking Time:

According to an example of the present invention, another technique used to further optimize bandwidth includes minimizing the number of sampling switches (also called track-and-hold switches) that are "on" at any given time to limited the number of sampling capacitors seen at the $1^{st}$ Buffer output at any given time. This can be achieved by minimizing the tracking time or, equivalently, the duty cycle of the tracking clock. For a given process node, there is a limit to how short the tracking time can be made. Factors affecting the minimum tracking time include rise/fall times, track-and-hold on-resistance, and sampling capacitor size. Finite rise/fall time reduces the amount of time the sampling switch is truly "on". Track-and-hold switch "on" resistance and sampling capacitor size sets the minimum time required to charge/discharge the sampling capacitor with sufficiently small settling error. Those of ordinary skill in the art will recognize other related factors that affect the tracking time.

Figure 7:
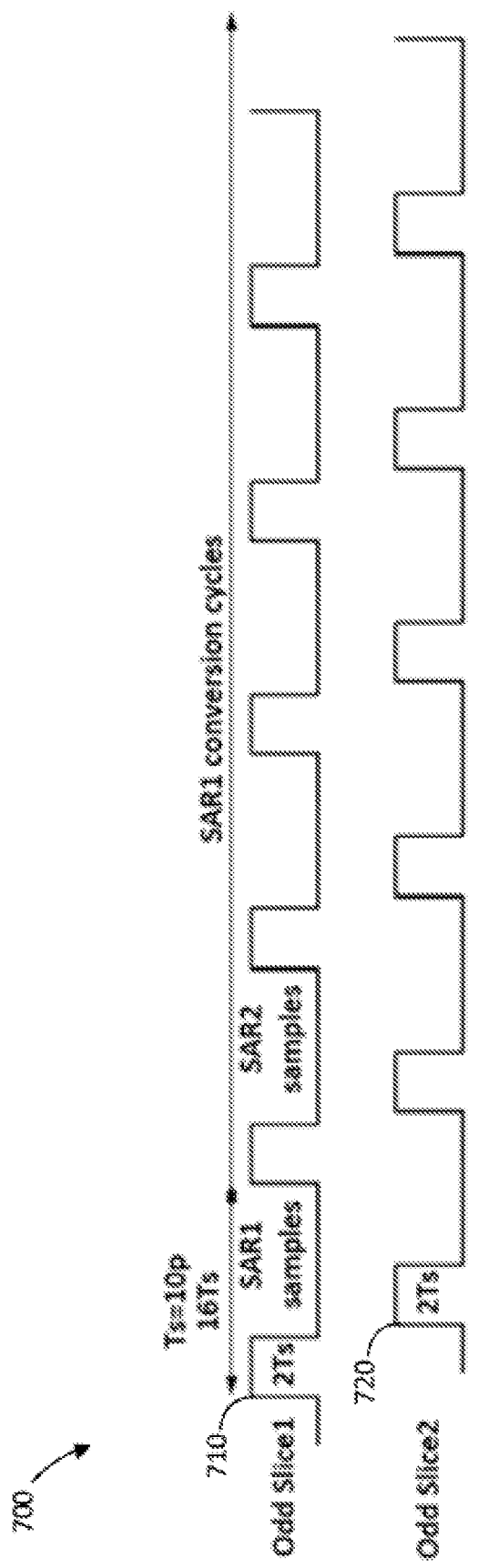
FIG. 7 is a simplified timing diagram illustrating a tracking time technique according to an example of the present invention.

FIG. 7 is a simplified timing diagram 700 illustrating a tracking time technique according to an example of the present invention. As shown, signal 710 (denoted "Odd Slice1") and signal 720 (denoted "Odd Slice2") each show that the track time is set to 2 Ts, where T is the aggregated sampling period. These slices represent example signals measured at the sampling switches of the sampling array described previously.

The present invention also provides for an orthogonal layout strategy for the signal and clock paths. In an example, the sampler aspect ratio is narrow and tall such that the time-interleaved array (e.g., in even/odd split configuration) is as narrow as possible to minimize skew and interconnect parasitic on the input signal and input clocks. Inside the track-and-hold slice (i.e., sampler layout cross-section), the track-and-hold, $2^{nd}$ Buffer, and $2^{nd}$ Buffer attenuator can be configured next to each other to minimize interconnect parasitics and maximize bandwidth. Further, a local clock buffer, the DC bias resistors (e.g., resistors 441 and 442 of FIG. 4), and the AC coupling capacitors (e.g., capacitors 451 and 452 of FIG. 4) can be configured in the track-and-hold slice after the $2^{nd}$ Buffer programmable clock attenuator (e.g., circuits 602 and 603 of FIGS. 6B and 6C, respectively). This configuration can avoid increasing parasitics on the signal path prior to the $2^{nd}$ Buffer to maintain high bandwidth while keeping the distance to the track-and-hold relatively short at the expense of a slightly longer interconnect at the output of the 2$^{nd}$ Buffer (i.e., to the SAH and sub-ADC array).

In a specific example, two 1$^{st}$ Buffer instances are used, one driving the even phase track-and-hold switches and the other driving the odd phase track-and-hold switches. In the split even-odd configuration, each 1$^{st}$ Buffer instance only sees one sampling capacitor at a given time, effectively reducing the capacitive load at the 1$^{st}$ Buffer output. Splitting the even and odd sampling phases between the two 1$^{st}$ Buffer instances combined with setting the tracking time to 2 Ts also has the benefit of minimizing coupling/ISI between adjacent phases, as mentioned previously. In various examples, a plurality of 1$^{st}$ Buffer instances are used, with each instance configured to a different subset of samplers in the sampler array. Further details are discussed in reference to FIG. 10.

Sampling Capacitor:

For a given sampling switch "on" resistance, reducing the size of the sampling capacitor improves the track-and-hold bandwidth and the overall AFE bandwidth. Given the kT/C noise contribution from the sampling capacitor, there is a limit to how small the sampling capacitor can be for a given the noise budget. In a high bandwidth AFE example, a portion of the AFE noise budget can be allocated to the track-and-hold capacitor to minimize its size as much as possible. In a specific example, the sampling capacitor is ~25 fF and it includes interconnect parasitic capacitance and the 2$^{nd}$ Buffer input capacitance. This allocation maximizes 2$^{nd}$ Buffer driving strength into the ADC. Those of ordinary skill in the art will recognize other variations, modifications, and alternatives to the sampling capacitor size depending on various tradeoffs and limitations.

Tracking Switch "on" Resistance

The track-and-hold "on" resistance can be further reduced with additional design techniques to improve the bandwidth-to-power ratio and ease the requirements of $C_{AFE}$ and $C_{ADC}$. According to examples of the present invention, these techniques can include, but are not limited to, making the switch transistor wider, increasing the overdrive voltage on the switch, and configuring the layout to minimize parasitic resistance.

In an example, the present invention can include configuring the switch transistor to be wider to reduce the switch resistance, which reduces noise due to allowance for greater switch capacitance. However, increasing the transistor width can come at the cost of increased parasitic capacitance (even in "off" state), which impacts the bandwidth at the 1$^{st}$ Buffer output. Therefore, for a given sampling capacitor and a given 1$^{st}$ Buffer output impedance, there is an optimal width for the track-and-hold switch depending on application.

In an example, the present invention can include increasing the overdrive (i.e., VGS-Vth) on the switch, which reduces its "on" resistance. Increasing the overdrive voltage also reduces the signal level dependent "on" resistance variation, which contributes to improving linearity. A number of techniques can be used to increase the overdrive voltage, including boot strapping, tracking, and AC coupling.

The boot strapping technique uses a switched capacitor circuit to push the track-and-hold above or below the supply. Using this type of circuit usually increases power dissipation, which is not desirable in application where minimizing power dissipation is critical.

The tracking technique uses a tracking circuit to sense the input voltage and level shift the clock voltage to maintain constant overdrive voltage. The tracker circuit adds capacitance at the track-and-hold input, which degrades bandwidth.

The AC coupling technique involves putting the track-and-hold clock in an AC coupled configuration and setting the DC bias voltage in such a way as to maximize the switch overdrive voltage while ensuring the switch is able to turn off. Due to the capacitive input, the AC coupling capacitor must be sufficiently large to mitigate attenuation of the clock amplitude. In an example, the present invention provides for using the AC coupling technique to increase the overdrive voltage of the track-and-hold switches.

Figure 8:
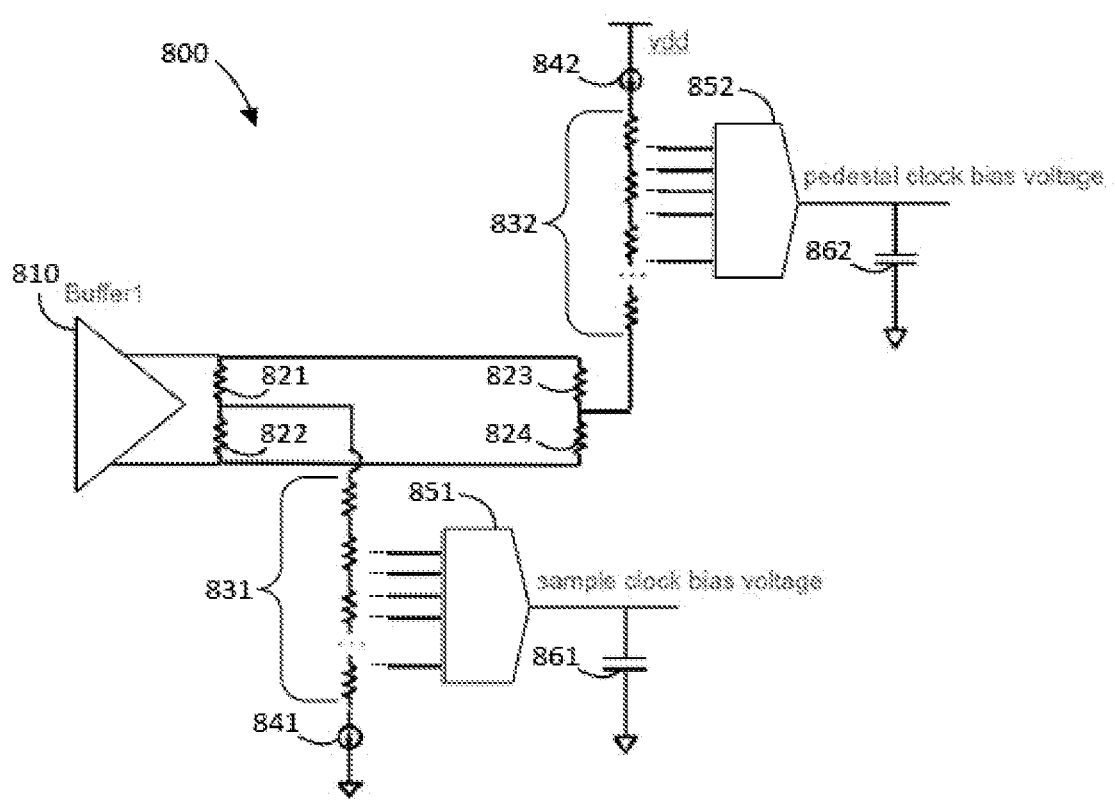
FIG. 8 is a simplified circuit block diagram illustrating a tracking and pedestal clock bias circuit according to an example of the present invention.

According to an example, the present invention provides for a bias technique to maintain optimal operation across variation of process, voltage, and temperature. FIG. 8 is a simplified circuit block diagram illustrating a tracking and pedestal clock bias circuit 800 according to an example of the present invention. This bias circuit 800 generates the DC bias voltage for the tracking and pedestal clocks following the 1$^{st}$ Buffer 810. As shown, this bias circuit 800 includes a bias sub-circuit for the sample clock bias voltage and a bias sub-circuit for the pedestal clock bias voltage. In an example, this bias circuit 800 is part of the 2$^{nd}$ interconnect 240, shown in FIG. 2, and configured between all 1$^{st}$ Buffer instances 230 and the sampler array 250.

For the sample clock bias voltage sub-circuit, two resistors 821/822 connected in series between the 1$^{st}$ Buffer positive and negative outputs sense 1$^{st}$ Buffer output common mode. A resistor ladder 831 (i.e., a plurality of resistors in series) is coupled on one end to the node between the resistors 821/822 and on the other end to a current source 841 that is coupled to ground. This configuration generates a small bias current to generate an IR voltage shift below the 1$^{st}$ Buffer output common-mode for the sample clock. The resistor ladder 831 includes tap points between each pair of resistors, and these tap points are coupled to an analog multiplexer 851. This analog multiplexer 851 selects which resistor ladder tap point is used to set the DC bias voltage. In a specific example, the multiplexer 851 can be configured to choose the tap point to maximize overdrive and performance. A grounded capacitor 861 is coupled to the output of the multiplexer 851.

The pedestal clock bias voltage sub-circuit has a similar configuration with two resistors 823/824 connected in series between the 1$^{st}$ Buffer positive and negative outputs sense 1$^{st}$ Buffer output common mode. Similarly, a resistor ladder 832 (i.e., a plurality of resistors in series) is coupled on one end to the node between the resistors 823/824 and on the other end to a current source 842 that is coupled to a voltage rail vdd. This configuration generates a small bias current to generate an IR voltage shift above the 1$^{st}$ Buffer output common-mode for the DC bias used for the pedestal clock. The resistor ladder 832 includes tap points between each pair of resistors, and these tap points are coupled to an analog multiplexer 852. This analog multiplexer 852 selects which resistor ladder tap point is used to set the DC bias voltage. Similar to the sample clock bias voltage sub-circuit, the multiplexer 852 can be configured to choose the tap point to maximize overdrive and performance. A grounded capacitor 862 is coupled to the output of the multiplexer 852.

Figure 9:
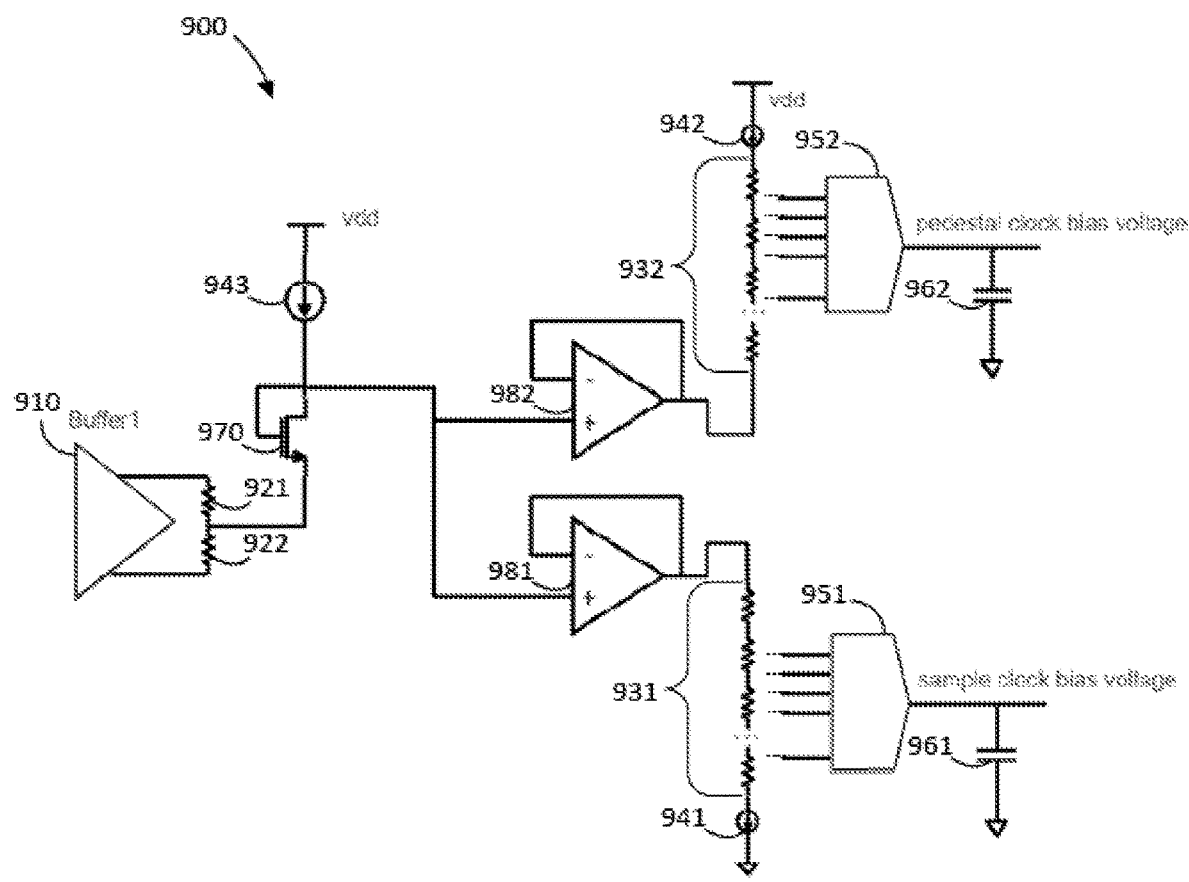
FIG. 9 is a simplified circuit block diagram illustrating a tracking and pedestal clock bias circuit according to an example of the present invention.

Another example of the bias circuit 900 is shown in FIG. 9, where a transistor 970 biased in sub-threshold is used to sense the threshold voltage, Vth, of the track-and-hold switch. Transistor 970 is shown as an NMOS transistor, but depending upon the application a PMOS transistor or other transistor technologies (e.g., BiCMOS, IGBT, etc.) may be used as well. Compared to the bias circuit 800 of FIG. 8, the bias circuit 900 only has two resistors 921/922 connected in series between the 1$^{st}$ Buffer positive and negative outputs sense 1$^{st}$ Buffer output common mode for both the sample and pedestal clock bias voltage sub-circuits. The drain of the transistor 970 is coupled to a current source 943 that is coupled to the voltage rail vdd. The source of the transistor 970 is coupled to the node between the resistors 921/922.

Following the transistor 970, there are two amplifiers 981/982, each in a negative feedback configuration. The first amplifier 981 and the second amplifier 982 are part of the sample clock bias voltage sub-circuit and the pedestal clock bias voltage sub-circuit, respectively, and can provide more voltage range flexibility. The gate of the transistor 970 is coupled to the positive input of both amplifiers 981/982. The output of the first amplifier 981 is coupled to resistor ladder/multiplexer configuration similar to the sample clock bias voltage sub-circuit of FIG. 8, with a resistor ladder 931 coupled a ground current source 941 and an analog multiplexer 951 with inputs coupled to the tap points between the resistors of ladder 931 and its output coupled to a grounded capacitor 961. Similarly, the output of the second amplifier 982 is coupled to resistor ladder/multiplexer configuration similar to the pedestal clock bias voltage sub-circuit of FIG. 8, with a resistor ladder 932 coupled a current source 942 that is coupled to the voltage rail vdd and an analog multiplexer 952 with inputs coupled to the tap points between the resistors of ladder 932 and its output coupled to a grounded capacitor 962.

This scheme tracks the transistor threshold voltage variation over process and temperature to provide more constant overdrive voltage over process and temperature and less variation in track-and-hold switch "on" resistance provided the Vth mismatch between the NMOS biased in sub-threshold and the switches is small and provided the DC offset in the unity gain op-amp is small. For those of ordinary skill in the art, it can be immediately recognized that other variants and schemes of similar strategy as shown in FIGS. 8 and 9 are also possible.

Figure 10:
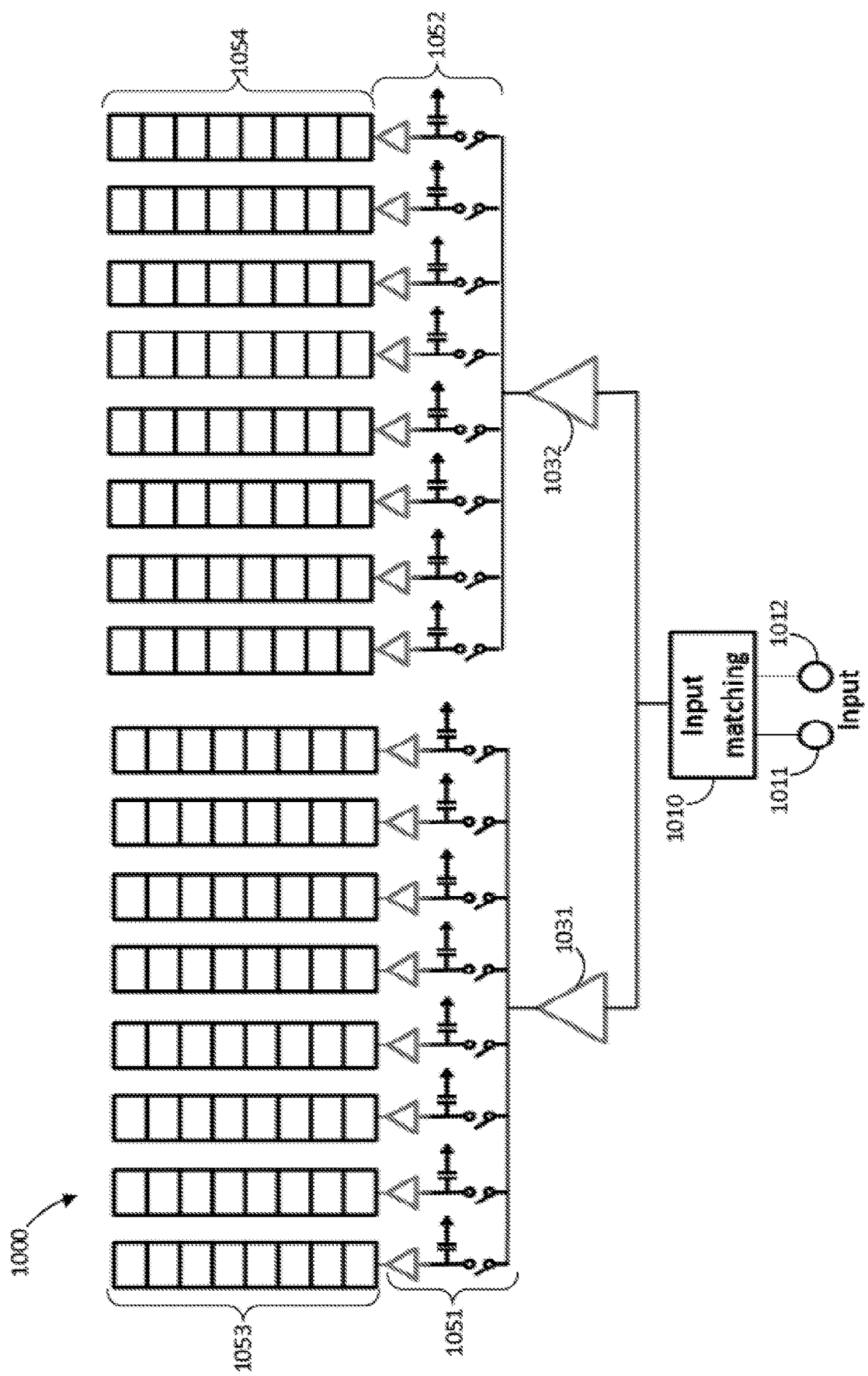
FIG. 10 is a simplified block diagram illustrating an analog front-end (AFE) device according to an example of the present invention.

FIG. 10 is a simplified block diagram illustrating an analog front-end (AFE) device according to an example of the present invention. FIG. 10 summarizes the overall architecture of an example of the present invention that is able to achieve sampling rate of up to 100 GS/s and achieve AFE bandwidth in excess of 40 GHz. As shown, AFE device 1000 includes the input matching network 1010, the 1$^{st}$ Buffers 1031/1032, the sampler array 1051/1052, and the time-interleaved SAH and sub-ADC array 1053/1054.

In a specific example, the AFE device 1000 the input matching network 1010 takes the inputs from the input bumps 1011 and 1012 and outputs to the 1$^{st}$ Buffer instances 1031 and 1032 (similar to the 1$^{st}$ Buffer instances shown in FIG. 4). Here, each of the 1$^{st}$ Buffer instances 1031/1032 drives eight time-interleaved sampler switches of the sampler array 1051/1052 (similar to the switches shown in FIG. 5) for a collective total of 16 phases in the first tier. In a specific example, the 2$^{nd}$ Buffer instance of each sampler in the array 1051/1052 (similar to the 2$^{nd}$ Buffer instances shown in FIG. 5) can drive eight SARs (i.e., 8 phases in the second tier) of the SAH and sub-ADC array 1053/1054 for an overall total of 128 phases. The 1$^{st}$ Buffer instance 1031 and the sampler array 1051 can be configured for the even sampling phases and drive the even portion of SAH and sub-ADC array 1053, while the 1$^{st}$ Buffer instance 1032 and the sampler array 1052 can be configured for the odd sampling phases and drive the odd portion SAH and sub-ADC array 1054. Alternatively, the even and odd configuration can be reversed. Those of ordinary skill in the art will recognize other variations, modifications, and alternatives.

Device 1000 can also incorporate placement and routing techniques between various components to ensure symmetry and minimize coupling. The 1$^{st}$ Buffer instances 1031 and 1032 can be configured symmetrically to minimize skew. The routing between even/odd 1$^{st}$ Buffer outputs and even/odd time-interleaved samplers of the sampler array 1051/1052 can also be configured symmetrically to minimize skew. As discussed previously, a plurality of 1$^{st}$ Buffer instances can be used, with each instance configured to a different subset of samplers in the sampler array and each sampler configured to a different subset of SARs. Even in the case shown here in FIG. 10, the 128 phases can be addressed with different configurations of the 1$^{st}$ Buffer instances, samplers, and SARs (e.g., 4 1$^{st}$ Buffer instances, each 1$^{st}$ Buffer configured to 4 samplers, and each sampler configured to 8 SARs). Although device 1000 is an example of a 2-tier configuration, the present invention provides for other multi-tier configurations having additional tiers that may be configured with different combinations of these components as well. Those of ordinary skill in the art will recognize other permutations of the 1$^{st}$ Buffer instances, samplers, and SARs.

According to an example, the present invention provides a method and struhe cture for an analog front-end (AFE) device configured for a high-baud receiver. The AFE device can include an input matching network receiving a first input and a second input, a first buffer device coupled to the input matching network, and a sampler array coupled to the first buffer device. The sampler array includes a plurality of sampler devices and is configured to receive a multi-phase clocking signal to drive the sampler devices.

In an example, the input matching network includes a first T-coil configured to the first input and a second T-coil configured to the second input. Each of the first and second T-coils comprises a negative-k T-coil, a positive coupling T-coil, or the like. Each of the first and second T-coils can also be coupled to a pair of Electro-Static-Discharge (ESD) diodes and coupled to a termination resistor.

In an example, the first buffer device can include a bias circuit coupled to a first class-AB source follower and a second class-AB source follower, the first class-AB source follower being configured to receive the first input, and the second class-AB source follower being configured to receive the second input. The first and second class-AB source followers can be configured with a DC bias resistor and an AC coupling capacitor. In a specific example, the first buffer device can include two or more buffers operating in parallel.

In an example, the AFE device can include a pedestal clock bias voltage circuit and a sample block bias voltage circuit coupled to the output of the first buffer device. The pedestal clock bias voltage circuit can include a first resistor ladder coupled to the output of the first buffer and having a plurality of first tap points, and can also include a first multiplexer coupled to first resistor ladder and configured to select between the plurality of first tap points. The sample clock bias voltage circuit can include a second resistor ladder coupled to the output of the first buffer and having a plurality of second tap points, and can also include a second multiplexer coupled to the second resistor ladder and configured to select between the plurality of second tap points.

In an example, each of the plurality of samplers of the sampler array includes a sampler switch coupled to a sampling capacitor and a second buffer device. The multi-phase clocking signal can be configured to drive the sampler switches of the plurality of samplers. Each buffer device includes a differential source follower having cross-coupled transistor stacks. In a specific example, each second buffer device includes a programmable attenuation circuit coupled to the differential outputs of the differential source follower of the second buffer. The programmable attenuation circuit can have one or more programmable attenuation branches with each branch having a voltage-controlled resistor.

In a specific example, the first buffer device can include a first buffer and a second buffer. A first portion of the plurality of sampler devices can be configured with the first buffer of the first buffer device for odd sampling phases, while a second portion of the plurality of sampler devices can be configured with the second buffer of the first buffer device for even sampling phases. In various examples, the first buffer devices can include a plurality of buffers, each configured for different sampling phases or different sets of samplers in the sampler array. Further, the sampler array can be configured in a multi-tiered configuration.

Many benefits are recognized through various embodiments of the present invention. Such benefits include increased bandwidth, sampling rate, and power efficiency. Depending upon the embodiment, the techniques implemented in the present invention are also cost-effective and relatively simple to implement. Other such benefits will be recognized by those of ordinary skill in the art.

Those skilled in the art would immediately recognize that there can be different permutations and combinations of the various techniques detailed previously can be done to target different applications with slightly different objectives. In a specific example, the disclosed techniques apply to any high baud-rate receiver in the range of 400 Gb or more to maximize any metric involving an arbitrary weighted ratio of bandwidth to power and noise. The scope of the present invention therefore is not limited to the specific examples presented (e.g., 400 Gb coherent), but shall include any and all high baud-rate receiver applications where the design target includes the objectives discussed previously.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An analog front-end (AFE) device, the device comprising:
   an input matching network receiving a first input and a second input of an input signal, wherein the input signal is a differential signal;
   a first buffer device coupled to the input matching network;
   a sampler array coupled to the first buffer device, the sampler array (i) having a plurality of sampler devices, (ii) being configured to receive a multi-phase clocking signal, and (iii) being configured to sample the input signal in accordance with the multi-phase clocking signal; and
   a plurality of second buffer devices, each second buffer device being (i) coupled to a respective sampler device among the plurality of sampler devices and (ii) including a programmable attenuation circuit configured to programmably adjust a gain of the input signal as sampled by the sampler array,
   the programmable attenuation circuit having one or more programmable attenuation branches, each of the one or more programmable attenuation branches having a voltage-controlled resistor.

2. The device of claim 1 wherein the input matching network includes a first T-coil configured based on the first input and a second T-coil configured based on the second input.

3. The device of claim 2 wherein each of the first and second T-coils comprises a negative-k T-coil or a positive coupling T-coil.

4. The device of claim 2 wherein each of the first and second T-coils is coupled to a pair of Electra-Static-Discharge (ESD) diodes, and wherein each of the first and second T-coils are coupled to a termination resistor.

5. The device of claim 1 wherein the first buffer device comprises two or more buffers operating in parallel.

6. The device of claim 1 wherein the first buffer device comprises a bias circuit coupled to a first class-AB source follower and a second class-AB source follower, the first class-AB source follower being configured to receive the first input, and the second class-AB source follower being configured to receive the second input.

7. The device of claim 6 wherein each of the first and second class-AB source followers is configured with a DC bias resistor and an AC coupling capacitor.

8. The device of claim 1 wherein each of the plurality of sampler devices comprises a sampler switch coupled to a sampling capacitor and a second buffer device, and wherein the multi-phase clocking signal drives the sampler switches of the plurality of sampler devices.

9. The device of claim 8 wherein the second buffer device of each sampler device comprises a differential source follower having cross-coupled transistor stacks.

10. The device of claim 1 wherein the plurality of sampler devices is configured in a multi-tiered array having two or more levels.

11. An analog front end (AFE) device, the device comprising
   an input matching network receiving a first input and a second input of an input signal, wherein the input signal is a differential signal;
   a first buffer device coupled to the input matching network;
   a sampler array coupled to the first buffer device, the sampler array (i) having a plurality of sampler devices, (ii) being configured to receive a multi-phase clocking signal, and (iii) being configured to sample the input signal in accordance with the multi-phase clocking signal; and
   a plurality of second buffer devices, each second buffer device being (i) coupled to a respective sampler device among the plurality of sampler devices and (ii) including a programmable attenuation circuit configured to programmably adjust a gain of the input signal as sampled by the sampler array,
   wherein each of the plurality of sampler devices comprises a sampler switch coupled to a sampling capacitor and one of the plurality of second buffer devices, and wherein the multi-phase clocking signal drives the sampler switches of the plurality of sampler devices,
   wherein the second buffer device of each of the plurality of sampler devices comprises a differential source follower having cross-coupled transistor stacks, and
   wherein the programmable attenuation circuit is coupled to differential outputs of the differential source follower of the second buffer device, the programmable attenuation circuit having one or more programmable attenuation branches, each of the one or more programmable attenuation branches having a voltage-controlled resistor.

12. The device of claim 11, wherein each of the programmable attenuation branches is configured at a different resistance strength determined by a scaling factor.

13. An analog front end (AFE) device, the device comprising
an input matching network receiving a first input and a second input of an input signal, wherein the input signal is a differential signal;
a first buffer device coupled to the input matching network;
a sampler array coupled to the first buffer device, the sampler array (i) having a plurality of sampler devices, (ii) being configured to receive a multi-phase clocking signal, and (iii) being configured to sample the input signal in accordance with the multi-phase clocking signal; and
a plurality of second buffer devices, each second buffer device being (i) coupled to a respective sampler device among the plurality of sampler devices and (ii) including a programmable attenuation circuit configured to programmably adjust a gain of the input signal as sampled by the sampler array;
a pedestal clock bias voltage circuit coupled to an output of the first buffer device, the pedestal clock bias voltage circuit having a first resistor ladder coupled to the output of the first buffer device and having a plurality of first tap points, and the pedestal clock bias voltage circuit having a first multiplexer coupled to first resistor ladder and configured to select between the plurality of first tap points; and
a sample clock bias voltage circuit coupled to the output of the first buffer device, the sample clock bias voltage circuit having a second resistor ladder coupled to the output of the first buffer and having a plurality of second tap points, and the sample clock bias voltage circuit having a second multiplexer coupled to the second resistor ladder and configured to select between the plurality of second tap points.

14. The device of claim 13 wherein the pedestal clock bias voltage circuit includes a first negative feedback amplifier configured between the first buffer device and the first resistor ladder; and wherein the sample clock bias voltage circuit includes a second negative feedback amplifier configured between the first buffer device and the second resistor ladder; and wherein a transistor biased in sub-threshold is configured between the first buffer device and the first and second negative feedback amplifiers.

15. An analog front-end (AFE) device, the device comprising:
an input matching network receiving a first input and a second input of a differential input signal, wherein the input matching network includes first T-coil configured to the first input and a second T-coil configured to the second input;
a first buffer device coupled to the input matching network, the first buffer device having a first buffer and a second buffer;
wherein each of the first and second buffers of the first buffer device comprises a bias circuit coupled to a first class-AB source follower and a second class-AB source follower, the first class-AB source follower being configured to receive the first input, and the second class-AB source follower being configured to receive the second input; and
a sampler array coupled to the first and second buffers, the sampler array (i) having a plurality of sampler devices, (ii) being configured to receive a multi-phase clocking signal, and (iii) being configured to sample the differential input signal in accordance with the multi-phase clocking signal,
each of the plurality of sampler devices comprising a sampler switch coupled to a sampling capacitor and a buffer, the multi-phase clocking signal being configured to drive the sampler switches of the plurality of sampler devices, and
the first buffer of the first buffer device and a first portion of the plurality of sampler devices being configured for sampling at odd sampling phases while the second buffer of the first buffer device and a second portion of the plurality of sampler devices are configured for sampling at even sampling phases; and
a programmable attenuation circuit configured to adjust a gain of the differential input signal as sampled by the sampler array, the programmable attenuation circuit having one or more programmable attenuation branches, each of the one or more programmable attenuation branches having a voltage-controlled resistor.

16. A high-baud rate receiver device, the device comprising:
an analog front-end (AFE) device, the AFE device comprising
an input matching network receiving a first input and a second input of a differential input signal;
a first buffer device coupled to the input matching network;
a sampler array coupled to the first buffer device, the sampler array (i) having a plurality of sampler devices, (ii) being configured to receive a multi-phase clocking signal, and (iii) being configured to sample the differential input signal in accordance with the multi-phase clocking signal;
a programmable attenuation circuit configured to adjust a gain of the differential input signal as sampled by the sampler array, the programmable attenuation circuit having one or more programmable attenuation branches, each of the one or more programmable attenuation branches having a voltage-controlled resistor; and
an analog-to-digital converter (ADC) device coupled to the AFE device, the ADC device including a sample-and-hold and sub-ADC array.

17. The device of claim 16 wherein the input matching network includes first T-coil configured based on the first input and a second T-coil configured based on the second input.

18. The device of claim 16 wherein the first buffer device comprises a bias circuit coupled to a first class-AB source follower and a second class-AB source follower, the first class-AB source follower being configured to receive the first input, and the second class-AB source follower being configured to receive the second input.

19. The device of claim 16 wherein each of the plurality of sampler devices comprises a sampler switch coupled to a sampling capacitor and a second buffer, the multi-phase clocking signal being configured to drive the sampler switches of the plurality of samplers.

20. The device of claim 16 wherein the first buffer device includes a first buffer and a second buffer, and wherein the sampler array is configured as a multi-tiered sampler array having a first portion configured with the first buffer of the first buffer device for odd sampling phases and a second portion configured with the second buffer of the first buffer device for even sampling phases.

* * * * *